United States Patent
Pei

(10) Patent No.: US 8,316,791 B2
(45) Date of Patent: Nov. 27, 2012

(54) MULTI-ENVIRONMENT COATING DEVICE

(75) Inventor: Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 262 days.

(21) Appl. No.: 12/916,618

(22) Filed: Oct. 31, 2010

(65) Prior Publication Data
US 2012/0037076 A1 Feb. 16, 2012

(30) Foreign Application Priority Data
Aug. 16, 2010 (TW) .............................. 99127360 A

(51) Int. Cl.
 B05C 13/02 (2006.01)
 B05C 11/00 (2006.01)
 B05C 5/00 (2006.01)
 C23C 14/00 (2006.01)
(52) U.S. Cl. ............ 118/66; 118/300; 118/50; 118/326; 118/500; 118/503; 118/58; 118/692; 118/715; 204/192.11
(58) Field of Classification Search ............ 118/50, 118/326, 300, 313–315, 715, 716, 734, 500, 118/503, 58, 59, 66, 692, 663, 695, 698; 414/225.01, 935, 936; 134/153, 198, 902; 204/192.11–192.15, 192.1
See application file for complete search history.

(56) References Cited

U.S. PATENT DOCUMENTS

| 5,038,707 A * | 8/1991 | Swain et al. ................ 118/58 |
| 2004/0020601 A1* | 2/2004 | Zhao et al. ............ 156/345.32 |
| 2005/0040349 A1* | 2/2005 | Kum et al. ............ 250/559.29 |
| 2008/0220621 A1* | 9/2008 | Shinozaki et al. ............ 438/795 |

* cited by examiner

Primary Examiner — Yewebdar Tadesse
(74) Attorney, Agent, or Firm — Altis Law Group, Inc.

(57) ABSTRACT

A coating device includes a main body defining a first and a second receiving rooms, a base received in the first receiving room for supporting work-pieces, a cleaning device opposing the first receiving room, a spraying device positioned on the top of the first receiving room for spraying coating materials to the work-pieces, a rotary drum device received in the first receiving room for uniformly coating the coating materials on the work-pieces, a heating device opposing the first receiving room for heating the coating materials to form a first film, a drive device for rotating, raising and lowering the base, a transportation device positioned in the second receiving room for transporting the base from the first receiving room to the second receiving room, a vacuum coating device opposing the second receiving room for coating a second film on the work-pieces after completing coating the first film on the work-pieces.

13 Claims, 8 Drawing Sheets

MULTI-ENVIRONMENT COATING DEVICE

BACKGROUND

1. Technical Field

The present disclosure relates to coating devices and, particularly, relates to a coating device capable of coating in a normal atmospheric environment and a vacuum environment sequentially.

2. Description of Related Art

Work-pieces need to be subjected to a rotary drum coating process, which can be carried out under normal atmospheric conditions provided by a rotary drum coating device and a vacuum coating process, which needs to be carried out under vacuum conditions provided by a vacuum coating device. The Work-pieces need to be transported between the rotary drum coating device and the vacuum coating device and may be contaminated during transportation.

Therefore, it is desirable to provide a coating device which can overcome the limitations described above.

DETAILED DESCRIPTION

Embodiments of the disclosure will now be described in detail, with reference to the accompanying drawings.

Figure 1:
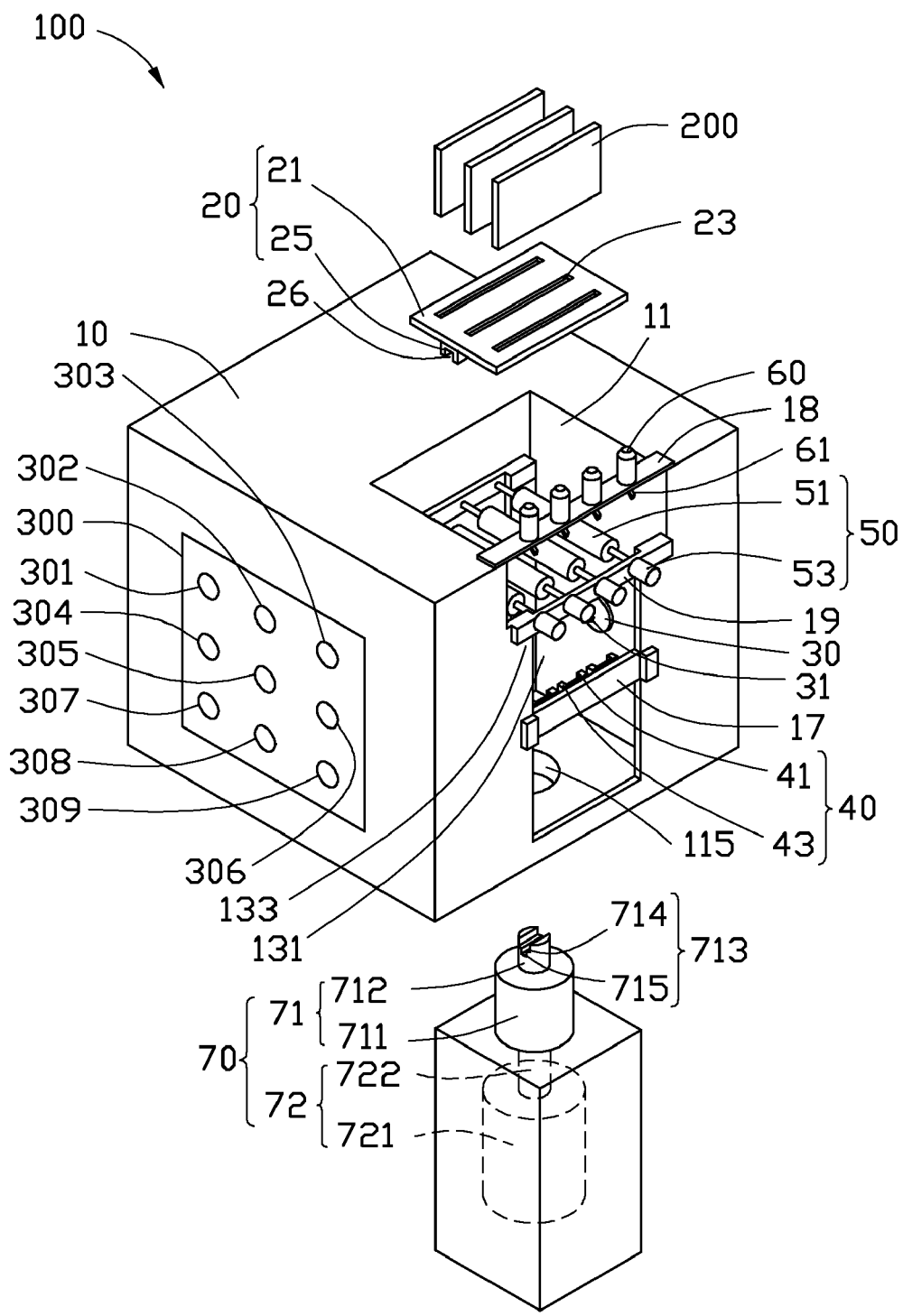
FIG. 1 is an isometric, exploded view of a coating device, according to an exemplary embodiment.
Figure 2:
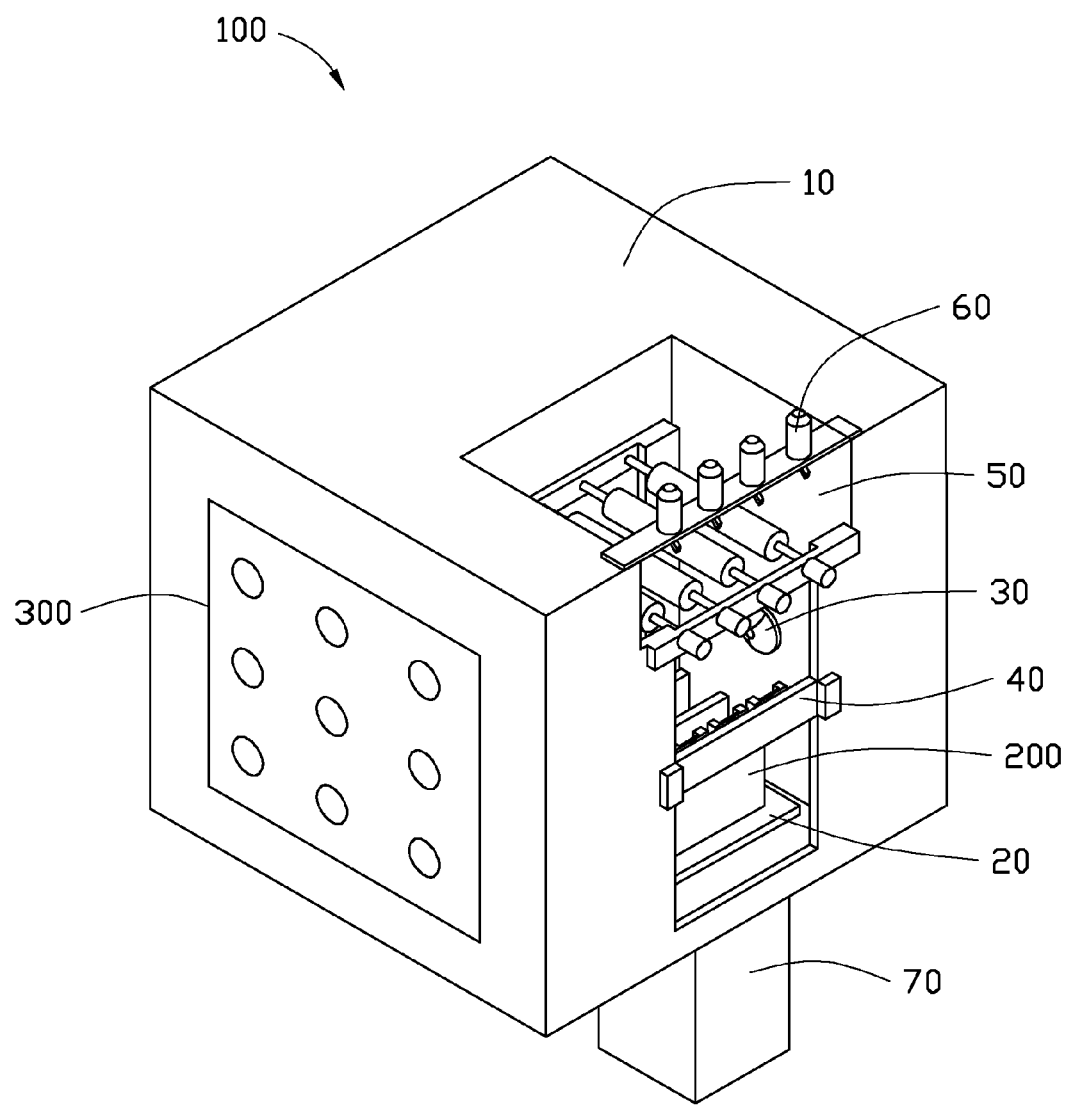
FIG. 2 is an isometric, assembled view of the coating device of FIG. 1.
Figure 3:
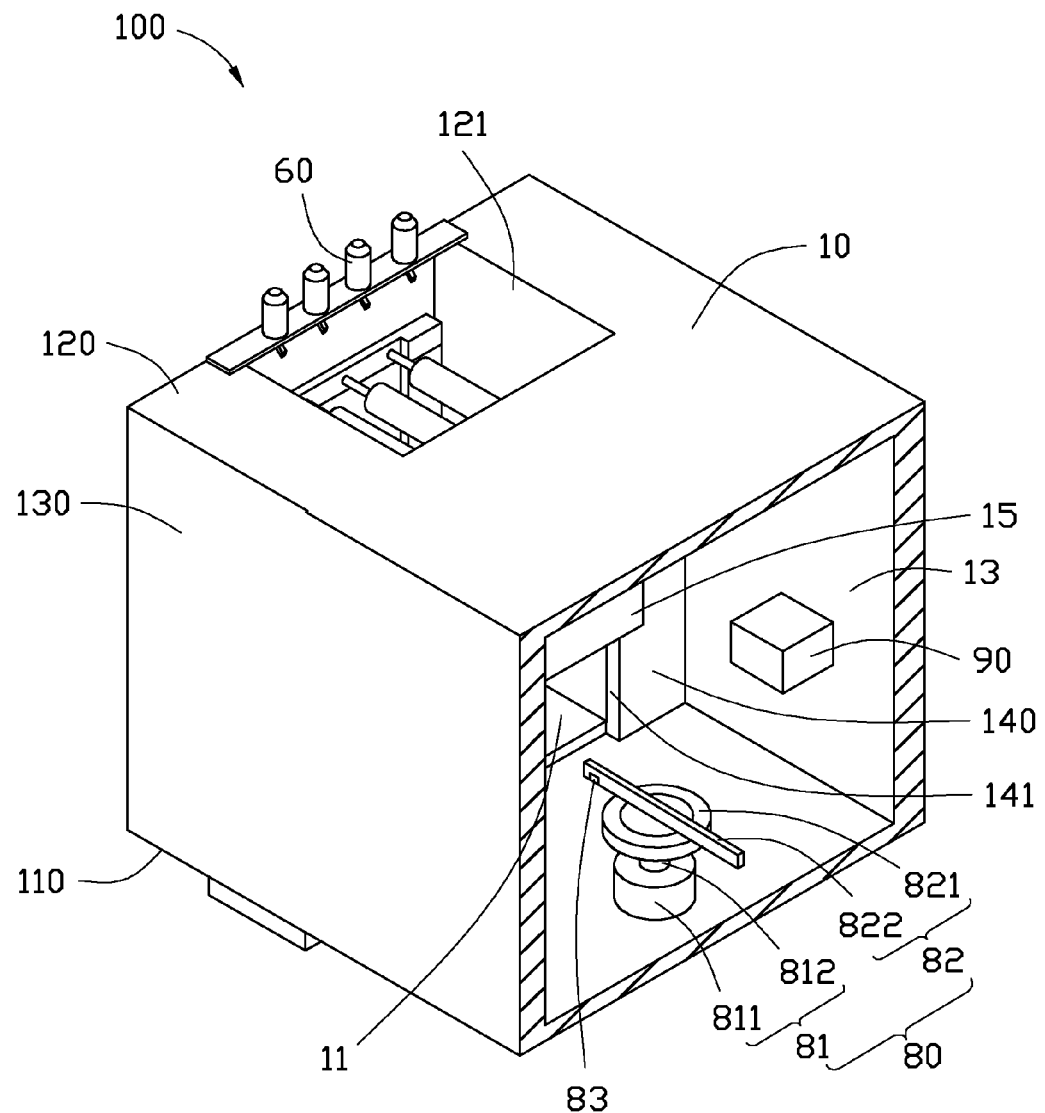
FIG. 3 is a schematic cross-sectional view of the coating device of FIG. 2.

Referring to FIGS. 1-3, a coating device 100, according to an exemplary embodiment, is provided to coat multi-films on work-pieces 200. The multi-film is coated in a normal atmospheric environment and a vacuum environment sequentially. The coating device 100 includes a main body 10. The main body 10 defines a first receiving room 11 and a second receiving room 13. The first receiving room 11 provides the normal atmospheric environment. The second receiving room 13 is vacuumized to provide the vacuum environment.

The coating device 100 further includes a base 20, a cleaning device 30, a heating device 40, a rotary drum device 50, a spraying device 60, a drive device 70, a transportation device 80, a vacuum coating device 90, and a control device 300. The base 20 is movably received in the first receiving room 11 and supports the work-pieces 200. The cleaning device 30 and the heating device 40 are fixed on the middle of the first receiving room 11, and clean and heat the work-pieces 200. The rotary drum device 50 is positioned above the heating device 40 and the spraying device 60 is positioned above the rotary drum device 50, and the rotary drum device 50 and the spraying device 60 coat a first film (not shown) on the work-pieces 200 in the normal atmospheric environment. The drive device 70 drives the base 20 to rotate in the first receiving room 11. The transportation device 80 transports the work-pieces 200 from the first receiving room 11 to the second receiving room 13. The vacuum coating device 90 is received in the second receiving room 13 and coats a second film (not shown) on the work-pieces 200. The control device 300 coordinates the cleaning device 30, the heating device 40, the rotary drum device 50, the spraying device 60, the drive device 70, the transportation device 80, and the vacuum coating device 90.

The main body 10 is a cuboid in shape and includes a bottom plate 110, an upper plate 120, and four side plates 130 connected with each other and positioned between the bottom plate 110 and the upper plate 120. A division plate 140 interconnects two opposite side plates 130, substantially parallel to the other two side plates 130, and divides the internal space of the main body 10 into the first receiving room 11 and the second receiving room 13. The bottom plate 110 of the first receiving room 11 defines a through hole 115, generally at the center thereof. The upper plate 120 of the second receiving room 13 defines a rectangular first opening 121. One of the side plates 130 opposing the division plate 140 defines a rectangular second opening 131 communicating with the first opening 121. The width of the first opening 121 is greater than the width of the second opening 131, therefore two opposite steps 133 are formed at edge of the second opening 131. The division plate 140 defines a communication hole 141 communicating the first receiving room 11 with the second receiving room 13. An electronic gate 15 is positioned on the division plate 140, and closes and opens the communication hole 141. A first support strip 17 bridges two sides of the second opening 131, generally at the middle thereof and supports the heating device 40. A second support strip 18 bridges two sides of the first opening 121, at a side thereof distant away from the division plate 140 and supports the spraying device 60. A pair of third support strips 19 is fixed on the opposite steps 133 and the division plate 140 and support the rotary drum device 50.

The base 20 includes a support plate 21. The support plate 21 defines a number of slots 23 for receiving the work-pieces 200. The slots 23 are equidistantly arranged and extended along a direction substantially parallel to the lengthwise direction of the support plate 21. The support plate 21 extending downwards a raised strip 25 from a bottom surface, generally at the center thereof. The extending direction of the raised strip 25 is the same as that of the slots 23. The raised strip 25 is made of magnet and defines a hollow 26 thereon.

The cleaning device 30 includes two cleaning nozzles 31 arranged and located generally at the middle of two opposite side plates 130 perpendicular to the division plate 140. The cleaning nozzles 31 communicate with an air source (not shown). The cleaning nozzles 31 can be adhered to the side plates 130 by various connection technologies such as glue or magnet attraction.

The heating device 40 is positioned on the first support strip 17. The heating device 40 includes a circuit board 41 positioned on the first support strip 17, and a number of heating elements 43 electrically connected to the circuit board 41 and face the first receiving room 11. The circuit board 41 controls the connection and disconnection of the heating elements 43 and adjusts the heating temperature of the heating elements 43.

The rotary drum device 50 includes a number of rollers 51 and a number of rolling drivers 52 corresponding to the rollers 51. The rollers 51 are equidistantly spaced and rotatably bridged between the pair of third support strips 19. A distance between each two adjacent rollers 51 is substantially equal to or slightly larger a thickness of each work-piece 200. The rolling drivers 52 are secured to the third support strips 19 fixed on the steps 133, and coupled with one end of the corresponding rollers 51. The rolling drivers 52 drive the rollers 51 to rotate.

The spraying device 60 includes a number of spraying nozzles 61 corresponding to the rollers 51. The spraying nozzles 61 are fixed on the second support strip 18 and communicate with a coating material source (not shown). The spraying nozzles 61 oppose the bottom plate 110 and spray the coating materials on the work-pieces 200.

The drive device 70 includes a first rotating drive 71 and a first linear drive 72. The first rotating drive 71 includes a first stator 711 and a first rotor 712 extending upward from the first stator 711. One end of the first rotor 712 away from the first stator 711 defines a support groove 713 generally at the center thereof. The support groove 713 includes a first groove 714 and a second groove 715 defined on a bottom surface of the first groove 714. The first groove 714 receives the raised strip 25, the width of the first groove 714 is slightly greater than the width of the raised strip 25. The width of the second groove 715 is equal to the width of the hollow 26. The first linear drive 72 includes a first linear stator 721 and a first linear moving element 722 extending upward from the first linear stator 721. The first linear moving element 722 is coaxial with and coupled with the first stator 712.

The transportation device 80 includes a second rotating drive 81 and a second linear drive 82. The second rotating drive 81 includes a second stator 811 and a second rotor 812 extending upward from the second stator 811. The second stator 811 is perpendicularly disposed on the bottom plate 110 and received in the second receiving room 13. The second linear drive 82 includes a second linear stator 821 and a second linear moving element 822 perpendicular to the second linear stator 821. The second linear stator 821 engages one side of the second linear moving element 822. The second linear stator 821 is coaxial with and coupled with the second rotor 812. The second linear moving element 822 is a magnetic strip. A pressure sensor 83 is positioned on the second linear moving element 822 to detect a pressure applied on the base 20.

The vacuum coating device 90 is arranged and located within the second receiving room 13 and attached to one of the side plates 130, generally at the middle thereof. When the communication hole 141 is closed by the electronic gate 15 and the second receiving room 13 is vacuumized, the vacuum coating device 90 is opened by the control device 300. In this embodiment, the vacuum coating device 90 can be a sputtering device, such as a chemical vapor deposition device.

The control device 300 includes a number of function switches, such as a first switch 301 controlling the first rotating drive 71. A second switch 302 controlling the first linear drive 72. A third switch 303 controlling the cleaning device 30. A fourth switch 304 controlling the heating device 40. A fifth switch 305 controlling the rotary drum device 50. A sixth switch 306 controlling the spraying device 60. A seventh switch 307 controlling the electronic gate 15, an eighth switch 308 controlling the vacuum coating device 90, and a ninth switch 309 for turning on or turning off the coating device 100.

In assembly, one side of each work-piece 200 is received in the corresponding slot 23 of the support plate 21. The base 20 supporting the work-pieces 200 is placed into the first receiving room 11 through the second opening 131. The first rotor 712 of the drive device 70 is inserted into the first receiving room 11 through the through hole 115. The raised strip 25 of the base 20 is received in the support groove 713 defined on the first rotor 712.

Figure 4:
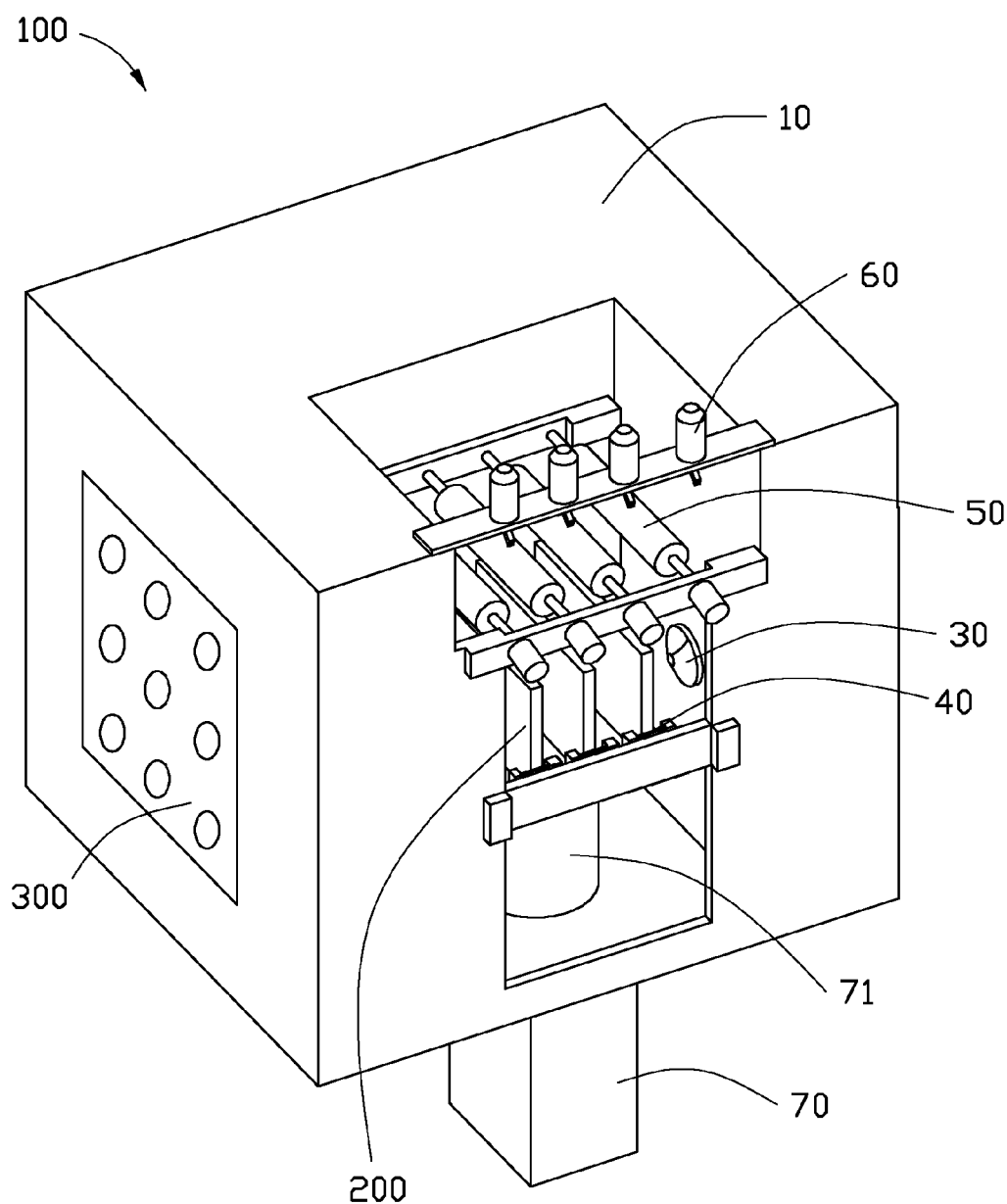
FIG. 4 is an isometric view of the coating device of FIG. 1, which is in a first working state.

Referring to FIG. 4, in a first state of the coating process, the work-pieces 200 are raised to oppose the cleaning device 30 by the first linear drive 72. Then, the first rotating drive 71 rotates the work-pieces 200 and the cleaning device 30 is turned on to clean the work-pieces 200.

Figure 5:
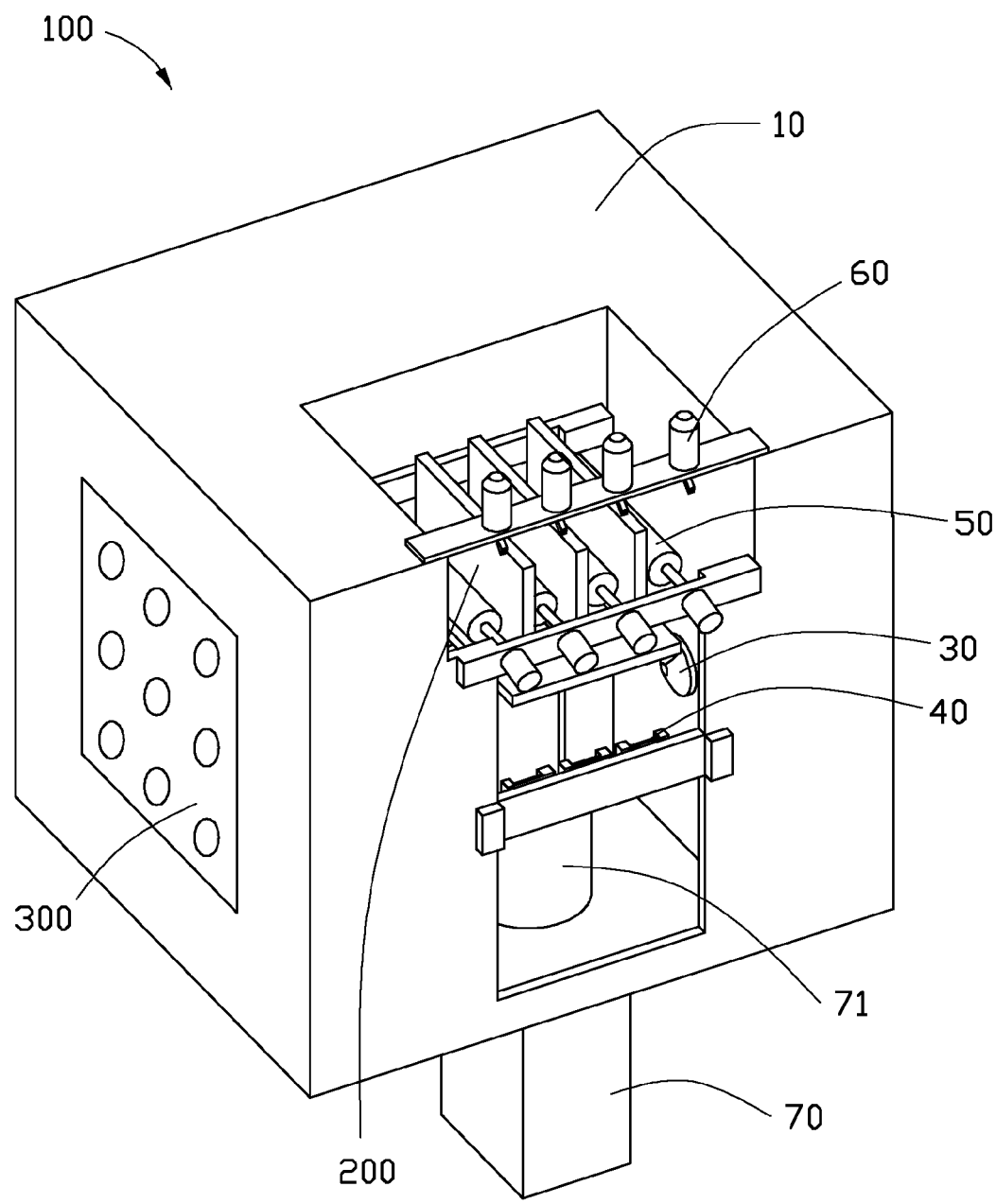
FIG. 5 is similar to FIG. 4, but showing a second working state of the coating device.

Referring to FIG. 5, in a second state of the coating process, after the work-pieces 200 are cleaned, the control device 300 turns off the cleaning device 30. The first rotating drive 71 rotates the work-pieces 200 to be parallel to the extending direction of the rollers 51 until the work-pieces 200 are aligned with gaps of the rollers 51. The work-pieces 200 are raised to receive in the gapes of the rollers 51 by the first linear drive 72. The rolling drivers 52 rotate the rollers 51 and the spraying device 60 is turned on to spray out coating materials on the work-pieces 200. In the process of rolling of the rollers 51, the coating materials are uniformly coated on the work-pieces 200.

Figure 6:
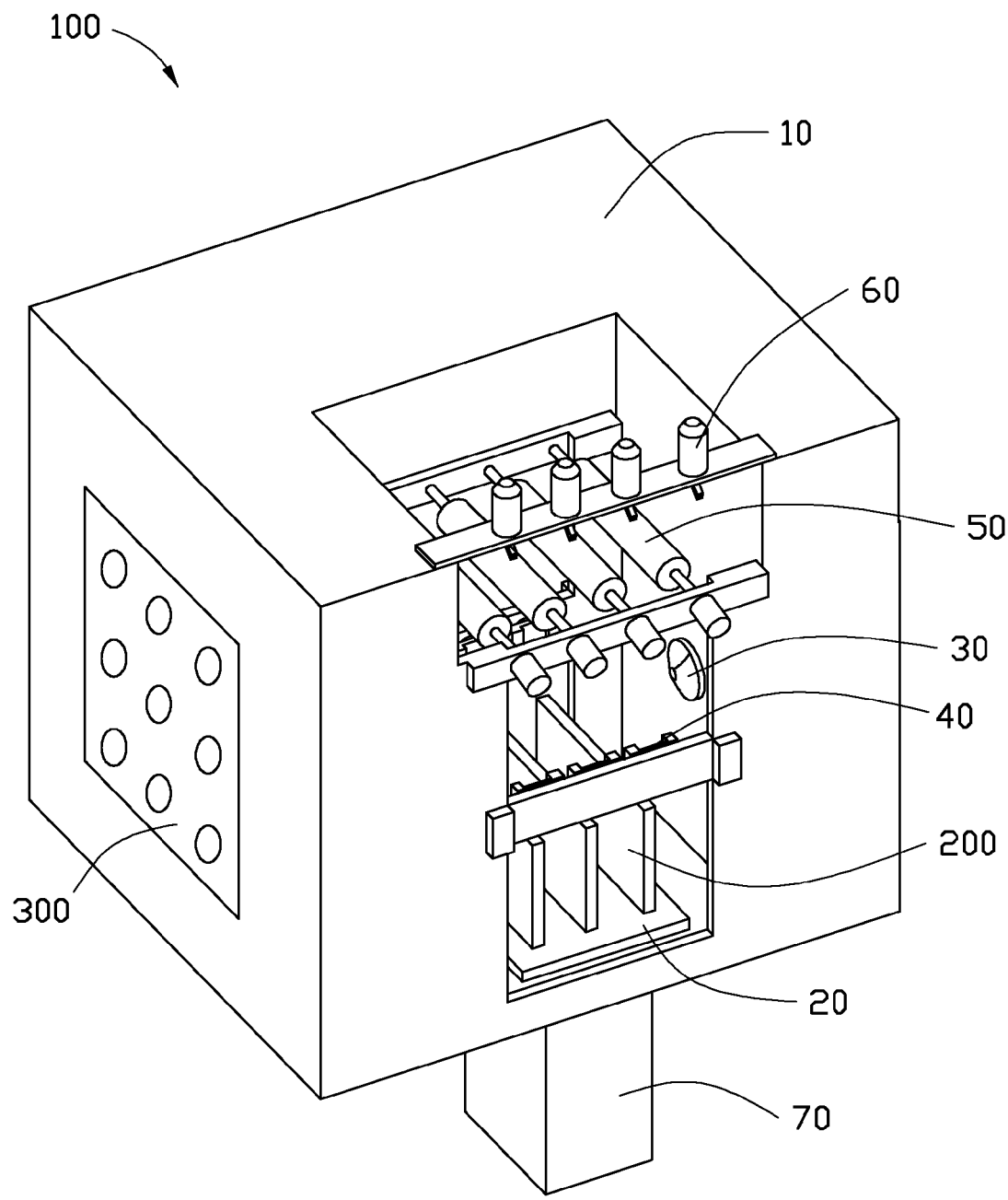
FIG. 6 is similar to FIG. 4, but showing a third working state of the coating device.

Referring to FIG. 6, in a third state of the coating process, the work-pieces 200 are lowered to the middle of the first receiving room 11. The work-pieces 200 remain parallel to the extending direction of the rollers 51. The heating device 40 is turned on to heat the coating materials coated on the work-pieces 200. When a crystal of the coating materials is formed on the work-pieces 200, a first film coated on the work-pieces 200 is obtained.

Figure 7:
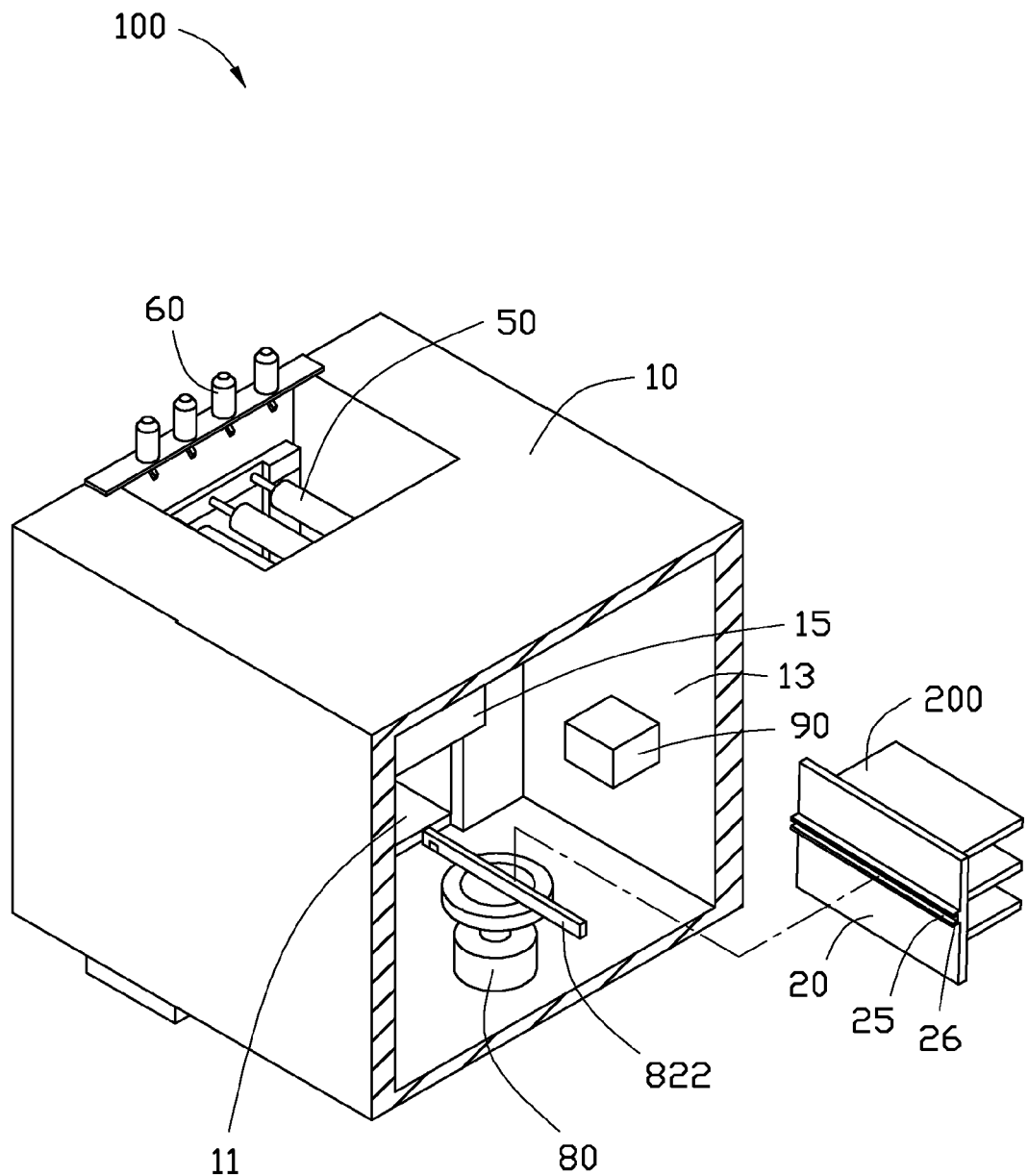
FIG. 7 is similar to FIG. 3, but showing a fourth working state of the coating device.

Referring to FIG. 7, in a fourth state of the coating process, the first rotating drive 71 rotates the raised strip 25 of the base 20 to be perpendicular to the electronic gate 15. The second linear moving element 822 of the second linear drive 82 protrudes to be received between the hollow 26 and the second groove 715. Then the first rotor 712 is actuated by the first stator 711 to separate from the base 20, the base 20 is supported by the second linear moving element 822. After the pressure sensor 83 detects the pressure of the base 20, the second linear moving element 822 brings the work-pieces 200 supported on the base 20 to the second receiving room 13. The base 20 is adhered on the second linear moving element 822 by magnet attraction.

Figure 8:
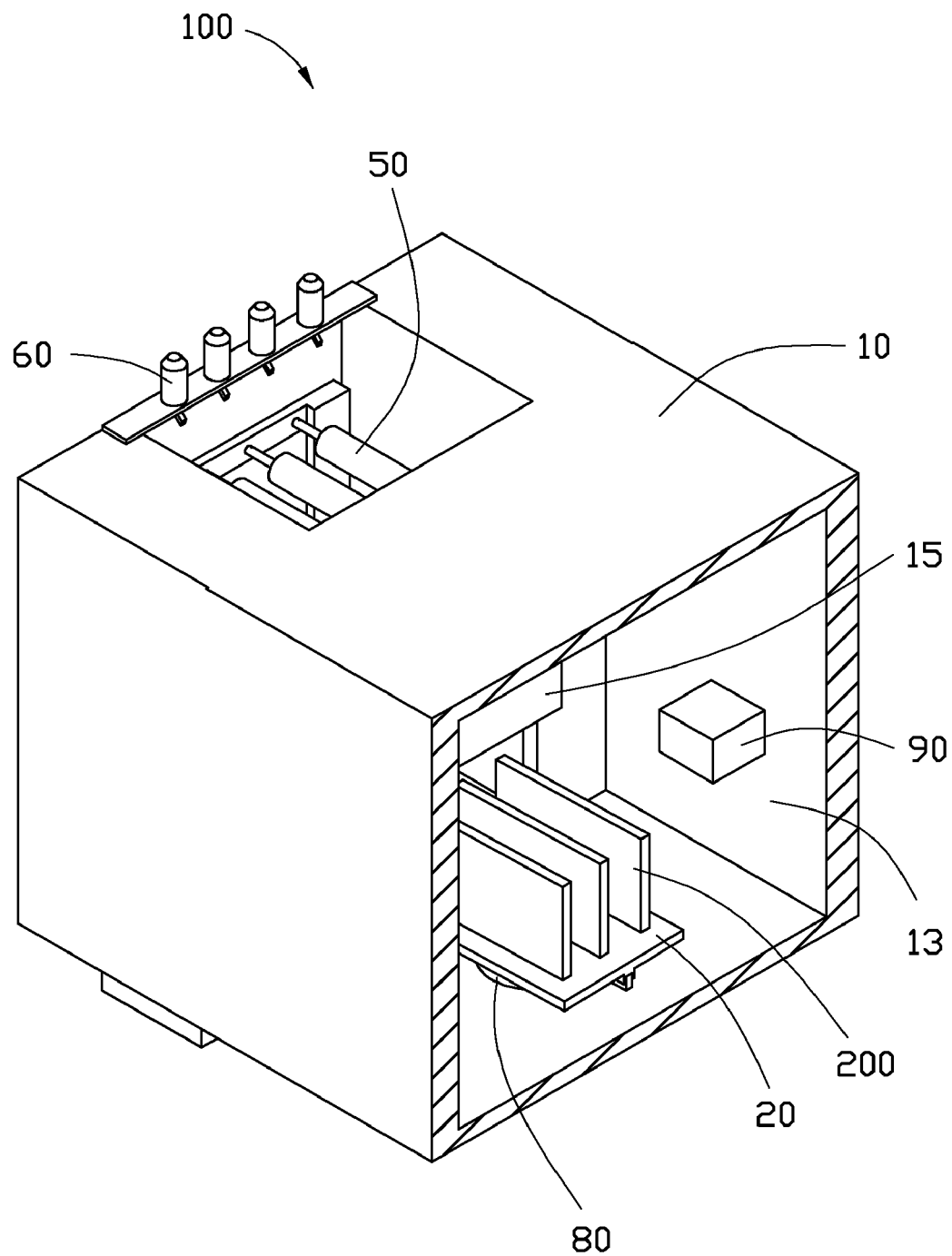
FIG. 8 is similar to FIG. 3, but showing a fifth working state of the coating device.

Referring to FIG. 8, in a fifth state of the coating process, the electronic gate 15 is closed and the second receiving room 13 is vacuumed. The work-pieces 200 coated the first film is coated a second film thereon by the vacuum coating device 90.

The present disclosure provides a coating device including a first receiving room and a second receiving room. The work-pieces can be coated with a first film in the normal atmospheric environment and then be coated with a second film in the vacuum environment sequentially. The work-pieces can be coated with multi-films in one coating device, and do not need to be transported from one place to another place, which ensure the quality of the work-pieces.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:
1. A coating device for coating a plurality of work-pieces, comprising:
a main body defining a first receiving room and a second receiving room and comprising an electronic gate, the electronic gate configured for controlling the communication of the first receiving room with the second receiving room;

a base received in the first receiving room, and defining a plurality of slots for receiving the work-pieces;

a cleaning device positioned on the main body and opposing the first receiving room, the cleaning device configured for cleaning the work-pieces;

a spraying device positioned on the top of the first receiving room and configured for spraying coating materials to the work-pieces;

a rotary drum device received in the first receiving room and positioned above the cleaning device and below the spraying device, and configured for uniformly coating the coating materials on the work-pieces;

a heating device positioned on the main body and opposing the first receiving room, the heating device configured for heating the coating materials coated on the work-pieces to form a first film;

a drive device comprising a first rotating drive configured for rotating the base and a first linear drive configured for raising or lowering the base in the first receiving room;

a transportation device positioned on a bottom surface of the second receiving room and configured for transporting the base from the first receiving room to the second receiving room; and a vacuum coating device positioned on the main body and opposing the second receiving room, the vacuum coating device configured for coating a second film on the work-pieces after completing coating the first film on the work-pieces.

2. The coating device of claim 1, further comprising a control device configured for controlling the cleaning device, the spraying device, the rotary drum device, the heating device, the drive device, and the vacuum coating device.

3. The coating device of claim 1, wherein the base comprises a support plate and a raised strip extending downwards from a bottom surface of the support plate, the raised strip defines a hollow thereon.

4. The coating device of claim 3, wherein the first rotating drive comprises a first stator and a first rotor, one end of the first rotor away from the first stator defines a support groove, the support groove comprises a first groove and a second groove defined on a bottom surface of the first groove, the first groove is configured for receiving the raised strip, the width of the second groove is equal to the width of the hollow.

5. The coating device of claim 4, wherein the first linear drive comprises a first linear stator and a first linear moving element extending upward from the first linear stator, the first linear moving element is coaxial with and coupled with the first stator.

6. The coating device of claim 4, wherein the transportation device comprises a second linear drive, the second linear drive comprises a second linear stator and a second linear moving element perpendicular to the second linear stator, the second linear stator engages one side of the second linear moving element, the second linear moving element is a magnetic strip, the raised strip is made of magnet.

7. The coating device of claim 6, wherein the transportation device comprises a pressure sensor positioned on the second linear moving element to detect a pressure applied on the base.

8. The coating device of claim 1, wherein the heating device is positioned on a first support strip and comprises a circuit board and a plurality of heating elements, the first support strip is positioned on one sidewall of the first receiving room, the circuit board is positioned on the first support strip, the heating elements are electrically connected to the circuit board and face the first receiving room.

9. The coating device of claim 1, wherein the rotary drum device is positioned on a pair of second support strips and comprises a plurality of rollers and a plurality of rolling drivers corresponding to the rollers, the pair of second support strips is positioned on two opposite sidewalls of the first receiving room, the rollers are equidistantly arranged and rotatably bridged between the second support strips, the rolling drivers are coupled with the rollers correspondingly.

10. The coating device of claim 9, wherein a distance between two adjacent rollers is equal to or slightly larger than the thickness of each work-piece.

11. The coating device of claim 1, wherein the main body comprises a bottom plate, an upper plate, and four side plates connected with each other and positioned between the bottom plate and the upper plate, a division plate interconnected between two opposite side plates and separating the first receiving room from the second receiving room.

12. The coating device of claim 11, wherein the division plate defines a communication hole communicating the first receiving room with the second receiving room, the electronic gate is positioned on the division plate and configured for closing and opening the communication hole.

13. The coating device of claim 11, wherein the bottom plate defines a through hole in the first receiving room; the first rotating drive of the drive device is inserted into the first receiving room through the through hole.

\* \* \* \* \*